United States Patent
Koo et al.

(10) Patent No.: US 7,862,748 B2
(45) Date of Patent: Jan. 4, 2011

(54) INDIUM TIN OXIDE TARGET, METHOD FOR MANUFACTURING THE SAME, TRANSPARENT CONDUCTIVE FILM OF INDIUM TIN OXIDE, AND METHOD FOR MANUFACTURING TRANSPARENT CONDUCTIVE FILM OF INDIUM TIN OXIDE

(75) Inventors: Bon Kyung Koo, Suwon-si (KR); Han Ho Yoon, Suwon-si (KR); Ju Ok Park, Suwon-si (KR); Hyung Ryul Park, Suwon-si (KR); Hyun Su Kim, Suwon-si (KR); Sung Ryong Choi, Suwon-si (KR); Joong Ryeol Choi, Suwon-si (KR); Pung Keun Song, Suwon-si (KR); Joon-Hong Park, Suwon-si (KR)

(73) Assignee: Samsung Corning Precision Materials Co., Ltd., Gumi-Si, Gyeongsangbuk-do (KR)

( * ) Notice: Subject to any disclaimer, the term of this patent is extended or adjusted under 35 U.S.C. 154(b) by 114 days.

(21) Appl. No.: 12/243,379

(22) Filed: Oct. 1, 2008

(65) Prior Publication Data

US 2009/0152511 A1 Jun. 18, 2009

(30) Foreign Application Priority Data

Dec. 14, 2007 (KR) .................. 10-2007-0131485

(51) Int. Cl.
*H01B 1/08* (2006.01)
(52) U.S. Cl. .............................. 252/520.1; 252/521.1
(58) Field of Classification Search .............. 252/520.1, 252/521.1; 204/192.15
See application file for complete search history.

(56) References Cited

U.S. PATENT DOCUMENTS

| | | | | | |
|---|---|---|---|---|---|
| 6,042,752 | A | * | 3/2000 | Mitsui | ................... 252/520.1 |
| 7,306,861 | B2 | * | 12/2007 | Inoue et al. | ................. 428/702 |
| 7,393,600 | B2 | * | 7/2008 | Inoue et al. | ................. 428/697 |
| 7,648,657 | B2 | * | 1/2010 | Inoue et al. | ............. 252/521.1 |
| 2010/0053523 | A1 | * | 3/2010 | Umeno et al. | ............... 349/122 |

FOREIGN PATENT DOCUMENTS

WO WO2007/058066 * 5/2007

* cited by examiner

*Primary Examiner*—Mark Kopec
(74) *Attorney, Agent, or Firm*—McDermott Will & Emery LLP

(57) ABSTRACT

Disclosed are an indium Tin Oxide (ITO) target, a method for manufacturing the same, a transparent conductive film of ITO, and a method for manufacturing the transparent conductive film of ITO. The ITO target includes at least one oxide selected from the group consisting of $Sm_2O_3$ and $Yb_2O_3$, wherein an amount of the oxide is about 0.5 wt. % to about 10 wt. % based on the weight of the target.

5 Claims, 4 Drawing Sheets

INDIUM TIN OXIDE TARGET, METHOD FOR MANUFACTURING THE SAME, TRANSPARENT CONDUCTIVE FILM OF INDIUM TIN OXIDE, AND METHOD FOR MANUFACTURING TRANSPARENT CONDUCTIVE FILM OF INDIUM TIN OXIDE

CROSS-REFERENCE TO RELATED APPLICATION

This application claims the benefit of Korean Patent Application No. 10-2007-0131485, filed on Dec. 14, 2007, in the Korean Intellectual Property Office, the entire disclosure of which is incorporated herein by reference.

BACKGROUND OF THE INVENTION

1. Field of the Invention

The present invention relates to manufacturing a sputtering target and manufacturing a transparent conductive film using the same, and more particularly, to an Indium Tin Oxide (ITO) target, a method for manufacturing the same, a transparent conductive film of ITO, and a method for manufacturing the transparent conductive film of ITO.

2. Description of Related Art

In general, an Indium Tin Oxide (ITO) film obtained by doping tin to Indium oxide may be employed as a electrode material of a solar cell and a Flat Panel Display (FPD) such as a Liquid Crystal Display (LCD), Plasma Display Panel (PDP), Electro Luminescence Display (ELD), and the like. In particular, demands for the ITO dramatically increase due to the growth in the FPD market requiring the transparent electrode, and a crystalline ITO film having a relatively low resistivity may be generally used in the FPD. The crystalline ITO film having the relatively low resistivity is obtained by performing film deposition at a high temperature or performing a predetermined heat treatment thereon after performing the film deposition. However, the crystalline ITO film is etched (patterned) only using a strong acid such as aqua regia (a mixed solution of nitric acid and hydrochloric acid), which results in a disadvantage such that disconnection or the narrowed line width is caused due to corrosion of gate or data lines at the time of etching the ITO film using the strong acid.

In order to overcome the above disadvantage, a method for manufacturing an amorphous ITO film having superior etching characteristics has been suggested. Specifically, manufacturing the amorphous ITO film by adding hydrogen or water to an injection gas under a low temperature atmosphere at the time of thin film deposition, and etching the amorphous ITO film thus obtained with a weak acid may improve patterning characteristics, and prevent occurrence of the corrosion of the gate or data lines. However, this method also may incur occurrence of anomalous discharge due to the added hydrogen or water at the time of sputtering, which results in disadvantages that anomalous protrusions referred to as nodules are created on an ITO target, and an impurity aggregate is created causing generation of a local high-resistance region on the film. Also, problems such as deterioration in adherence and increase in contact resistance each between the film and the substrate, debris after etching, and the like may be created.

Also, an Indium Zinc Oxide (IZO) has been devised as a target material for manufacturing the amorphous film, which has superior characteristics as an amorphous film but has a relatively poor resistivity and transmittance and requires a relatively high cost in comparison with the ITO. In addition, the IZO having characteristics such as being melted even in an aluminum etching agent may encounter difficulties in a case where a reflection electrode is formed on the transparent electrode.

SUMMARY OF THE INVENTION

An aspect of the present invention provides an Indium Tin Oxide (ITO) target and a method for manufacturing the same which may be etched with a weak acid, thereby preventing occurrence of corrosion of gate or data lines and creation of debris.

Another aspect of the present invention provides a transparent conductive film of ITO and a method for manufacturing the same which may be excellent in etching workability even with a weak acid, and have a relatively low resistivity and high transmittance, thereby exhibiting excellent electric and optical characteristics.

According to an aspect of the present invention, there is provided an ITO target including at least one oxide selected from the group consisting of $Sm_2O_3$ and $Yb_2O_3$. In this instance, an amount of the oxide may be about 0.5 wt. % to about 10 wt. % based on the weight of the target.

According to an aspect of the present invention, there is provided a method for manufacturing an ITO target, the method including: mixing at least one oxide powder selected from the group consisting of $Sm_2O_3$ powder and $Yb_2O_3$ powder with $In_2O_3$ powder and $SnO_2$ powder to prepare a mixed powder; mixing and wet milling the mixed powder, a dispersing agent, and a dispersion medium to prepare a slurry; drying the slurry to prepare a granular powder; molding the granular powder to form a molded body; and sintering the molded body. In this instance, an amount of the oxide powder may be about 0.5 to about 10 wt. % based on the weight of the mixed powder.

According to an aspect of the present invention, there is provided a transparent conductive film of an indium tin oxide, in which the film is deposited on a substrate using an indium tin oxide target in a DC sputtering scheme, the indium tin oxide target including at least one oxide selected from the group consisting of $Sm_2O_3$ and $Yb_2O_3$, and the film contains the oxide in an amount of about 0.5 to about 10 wt. %.

According to an aspect of the present invention, there is provided a method for manufacturing a transparent conductive film of an ITO, the method including: preparing an ITO target including at least one oxide selected from the group consisting of $Sm_2O_3$ and $Yb_2O_3$, an amount of the oxide being about 0.5 to about 10 wt. % based on the weight of the target; depositing an amorphous transparent film on a substrate using the target in a DC sputtering scheme; and etching the transparent film with a weak acid.

BRIEF DESCRIPTION OF THE DRAWINGS

The above and other aspects of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS

Figure 1:
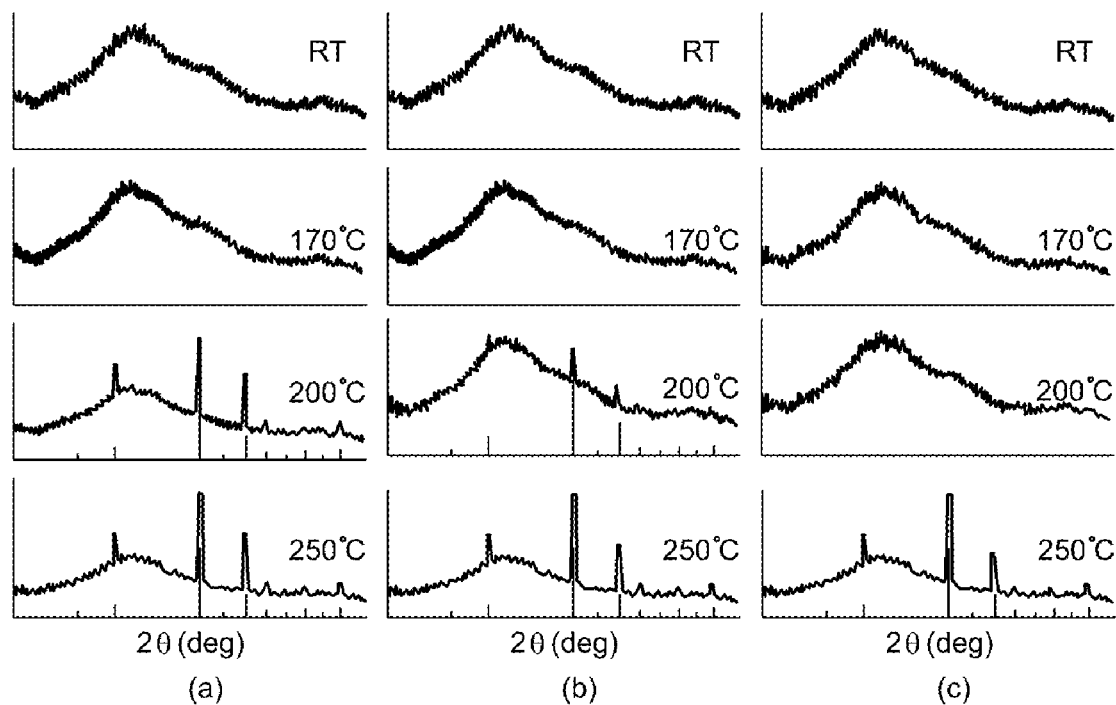
FIG. 1 is a graph illustrating x-ray diffraction results with respect to a transparent thin film formed by depositing an Indium Tin Oxide (ITO) target according to exemplary embodiments of the present invention at about Room Temperature (RT), about 170° C., about 200° C., and about 250° C., respectively.

Reference will now be made in detail to exemplary embodiments of the present invention, examples of which are illustrated in the accompanying drawings, wherein like reference numerals refer to the like elements throughout.

An Indium Tin Oxide (ITO) target according to the present invention includes at least one oxide selected from the group consisting of $Sm_2O_3$ and $Yb_2O_3$, and thereby samarium or ytterbium is doped in the ITO, or samarium and ytterbium are simultaneously doped therein. An amount of the oxide acting as a dopant is about 0.5 wt. % to about 10 wt. % based on the weight of the target, and is preferably about 3 to about 8 wt. %.

Crystallization of the ITO target advances when the amount of the oxide is less than about 0.5 wt. % even though film deposition is performed at a low temperature, and the ITO target thus obtained has disadvantageously similar characteristics as in a pure ITO target. Specifically, etching on the ITO target is required to be performed using a strong acid because of failure in etching using a weak acid, which results in creating debris after performing the etching. Crystallization of the pure ITO target without a dopant added therein may advance at about 140° C. According to the present invention, there is provided an ITO target where an amorphous film is deposited even at room temperature or at about 170° C. or less without adding hydrogen or water therein.

Also, characteristics of a transparent conductive film (transparent electrode) may be deteriorated due to a rapid increase in resistivity when the amount of oxide is about 10 wt. % or more, and thus crystallization may be not performed even when performing heat treatment at about 200° C.

The ITO target according to the present invention may include $Sm_2O_3$ and $Yb_2O_3$, and [Sm]/([In]+[Sm]) is about 0.005 to about 0.18, and [Yb]/([In]+[Yb]) is about 0.005 to about 0.18. In this instance, [Sm] denotes a number of samarium atoms per unit mass of the target, [Yb] denotes a number of ytterbium atoms per unit mass of the target, and [In] denotes a number of indium atoms per unit mass of the target. A crystallized film is formed even at a low temperature when [Sm]/([In]+[Sm]) and [Yb]/([In]+[Yb]) are less than about 0.005 within the ITO target, thereby results in failure of weak acid etching. Also, resistivity of the formed film increases when the [Sm]/([In]+[Sm]) and [Yb]/([In]+[Yb]) are more than about 0.18, thereby deteriorating electric characteristics of the conductive film.

A relative density of the ITO target according to the present invention is about 95% or more relative to a theoretical density. A density of a sputtering target is about 6.8 g/cc or more, more preferably about 7.0 g/cc or more, and most preferably about from 7.1 g/cc to about 7.18 g/cc. Anomalous discharge (arcing) and nodule may occur due to deterioration in electric characteristics when a relative density of the sputtering target is less than about 95%, which results in rapid reduction in efficiency of ITO target manufacturing due to frequent occurrence of anomalous discharge.

A bulk resistance of the ITO target is about 250 µΩ·cm or less. There arises a problem in that a Direct Current (DC) sputtering is not stably performed when the bulk resistance is relatively large. Thus, according to the present invention, samarium and ytterbium may be doped into the ITO target, thereby reducing the bulk resistance.

A method for manufacturing the ITO target according to an exemplary embodiment of the invention includes mixing at least one oxide powder selected from the group consisting of $Sm_2O_3$ powder and $Yb_2O_3$ powder with $In_2O_3$ powder and $SnO_2$ powder to prepare a mixed powder; mixing and wet milling the mixed powder, a dispersing agent, and a dispersion medium to prepare a slurry; drying the slurry to prepare a granular powder; molding the granular powder to form a molded body; and sintering the molded body. In this instance, an amount of the oxide powder is about 0.5 to about 10 wt. % based on the weight of the mixed powder. Hereinafter, the method for manufacturing the ITO target according to the present exemplary embodiment of the invention will be described in detail in a stepwise manner.

First, $In_2O_3$ powder and $SnO_2$ powder each having a mean particle diameter of several µm or less are compounded in a predetermined compounding ratio, for example, 8.5:1.5 or 9.5:0.5, and then the oxide powder is mixed with the resultant powder to thereby prepare the mixed powder. In this instance, the mixed powder may include $Sm_2O_3$ powder and $Yb_2O_3$ powder, and [Sm]/([In]+[Sm]) may be about 0.005 to about 0.18, and [Yb]/([In]+[Yb]) may be about 0.005 to about 0.18. Here, [Sm] is a number of samarium atoms per unit mass of the target, [Yb] is a number of ytterbium atoms per unit mass of the target, and [In] is a number of indium atoms per unit mass of the target.

Next, the slurry may be prepared by mixing and wet milling the mixed powder, the dispersing agent, and the dispersion medium. As examples of the dispersing agent, a polycarboxylic acid salt may be used, however is not limited thereto. More specifically, a polycarboxylic acid-ammonium salt, a polyacrylic acid-ammonium salt, a polyacrylic acid-amine salt, and the like may be used alone, or in combination of two or more thereof The mean particle diameter of the mixed powder obtained by the wet milling may be adjusted to be preferably 0.5 µm or less, and more preferably 0.3 µm or less.

Next, a binder may be added in the slurry. Then, the wet milling may be additionally performed on the slurry with the binder added therein. In this instance, the binder functions to maintain a molding strength of the molded body in the processes of the drying the slurry to prepare the granular powder and molding the granular powder to form a molded body. As examples of the binder, polyvinyl alcohol (PVA), poly ethylene glycol (PEG), and the like are used alone or in combination two or more, however are not limited thereto. The binder may be added in an amount of about 0.01 wt. % to about 5 wt. % relative to a solid content of the slurry, and more preferably about 0.5 wt. % to about 3 wt. %. In this instance, a molding density in the process of molding the granular powder is reduced when the amount of the binder is not in the above-mentioned range, which may result in a reduction in a sintered density of a sintered body of ITO. The reduction in the sintered density may incur an increase in the target resistance, thereby suffering to manufacture the sputtering target enabling the DC sputtering. Unlike the above mentioned, the binder may be added in the process of preparing the slurry.

Next, the mixed slurry with the binder added therein is sprayed and dried to prepare the granular powder. In this instance, well-known techniques may be used for spraying and drying the mixed slurry, however the present is not limited thereto.

Next, the molded body is manufactured by a Cold Press (CP) method and a Cold Isostatic Press (CIP) method, or a combination method thereof. Also, as a method for manufacturing the molded body, a slip casting method or a hot press method may be used.

The sintered body of ITO may be manufactured by sintering the molded body after the forming the molded body. Components composing the sintered body of ITO may exist in a uniform state through the sintering process.

The sintering of the molded body may be performed at about 1,400° C. to about 1,650° C. A sintered atmosphere at the time of sintering the molded body may be a control factor required for manufacturing the sintered body of ITO having a low bulk resistance at a lower temperature. The sintering of the molded body may be performed in a chamber having an air atmosphere, or in another chamber where an air atmosphere and an oxygen-free atmosphere are alternatively provided for the purpose of controlling an amount of oxygen.

When the sintering process is completed, the sintered body of ITO is bonded to a copper backing plate to manufacture the ITO sputtering target according to the present invention.

Also, the transparent conductive film of ITO according to an exemplary embodiment of the invention is deposited on a substrate using the ITO target in the DC sputtering scheme. In this instance, the ITO target includes at least one oxide selected from the group consisting of $Sm_2O_3$ and $Yb_2O_3$, and the film contains the oxide in an amount of about 0.5 to about 10 wt. %. Specifically, since the transparent conductive film of ITO may be manufactured using the ITO target, contents of components of the transparent conductive film of ITO may be the same as those of the ITO target.

The transparent conductive film of ITO may have a light transmittance of about 80% or more in a wavelength of about 550 nm. Also, a resistivity of the transparent conductive film of ITO may be about 150 to about 500 μΩ·cm.

In addition, a method for manufacturing the transparent conductive film of ITO according to an exemplary embodiment of the invention includes preparing an indium tin oxide target including at least one oxide selected from the group consisting of $Sm_2O_3$ and $Yb_2O_3$, an amount of the oxide being about 0.5 to about 10 wt. % based on the weight of the target; depositing an amorphous transparent film on a substrate using the target in a DC sputtering scheme; and etching the transparent film with a weak acid. In this instance, the depositing may be performed at room temperature to about 170° C.

The method for manufacturing the transparent conductive film of ITO according to the present exemplary embodiment of the invention may include heat-treating and crystallizing the etched transparent film. In this instance, the heat-treating may be performed at about 170 to about 250° C.

Hereinafter, the ITO target, the method for manufacturing the same, the transparent conductive film of ITO, and the method for manufacturing the same according to the present invention will be described in detail by examples. It is to be understood, however, that these examples are for illustrative purpose only, and are not construed to limit the scope of the present invention.

EXAMPLES 1 TO 5

An $In_2O_3$ powder having a mean particle diameter of 1 μm or less and a $SnO_2$ powder having a mean particle diameter of 3 μm or less were mixed in a weight ratio of 9:1. Next, a $Sm_2O_3$ powder having a mean particle diameter of about 10 μm or less was mixed with a slurry tank to prepare a mixed powder in such a manner that an amount of the $Sm_2O_3$ powder was about 0.5 wt. % in Example 1, 1.0 wt. % in Example 2, 3.0 wt. % in Example 3, 5.0 wt. % in Example 4, 7.0 wt. % in Example 5, each based on a total weight of the entire powder, respectively.

A pure water, a dispersing agent, and a binder were added in the mixed powder, and a wet milling was performed on the resultant powder using a hard zirconia ball mill. The resultant powder was required to be pulverized for one hour for milling and mixing to prepare a slurry having a mean slurry particle size of 1 μm or less.

The slurry thus obtained was dried using a spray dryer to prepare a granular powder, and the granular powder was molded with a relatively high pressure of about 300 MPa using a Cold Isostatic Press (CIP) to prepare a molded body. Next, the molded body was sintered at a high temperature of 1,600° C. for one hour under an air atmosphere to manufacture a sintered body of ITO containing samarium.

A sputtering surface of the sintered body of ITO thus obtained was grinded using a grinder to have a diameter of 3 inches and a thickness of 5 nm, and a backing plate was bonded to the sintered body of ITO using an indium-based alloy to thereby manufacture a target assembly of a sintered body. The presence of $Sm_2O_3$ within the target would be found by an Electron Probe Micro Analyzer (EPMA).

Results obtained by measuring a bulk resistance of the target according to each Example are shown in Table 1 below.

The target according to each Example was equipped in a magnetron sputtering apparatus, and oxygen and an argon gas were injected at room temperature to form a transparent conductive film having a thickness of about 150 nm on a glass substrate.

Results obtained by measuring a light transmittance in a wavelength of about 550 nm with respect to the glass substrate with the transparent conductive film adhered thereon are shown in Table 1 below, in which a high transmittance of about 86% or more was shown. Also, a resistivity of the transparent conductive film deposited at room temperature and is shown in Table 1 below. As shown in Table 1, it was found that the resistivity of the transparent conductive film of an amorphous formed in Examples 1 to 5 was within a range of about 529 to about 1,321 μΩ·cm.

Next, the transparent conductive films in Examples 1 to 5 were subjected to a heat-treatment at about 250° C. for 60 minutes to crystallize, and then results obtained by measuring the resistivity thereof are shown in Table 1 below. As shown in Table 1 below, it was found that the resistivity of each of the transparent conductive films in which crystallization was achieved through a heat-treatment of high temperature was within a range of about 176 to about 333 μΩ·cm.

FIG. 1 is a graph illustrating x-ray diffraction results with respect to a transparent thin film formed by depositing the ITO target according to Examples 3 to 5 at Room Temperature (RT), about 170° C., 200° C., and 250° C., respectively. (a), (b), and (c) of FIG. 1 may correspond to Examples 3, 4, and 5, respectively.

As shown in FIG. 1, it was found that a peak was observed at about 200° C. in Examples 3 and 4, and a peak was observed at about 250° C. in Example 5 to achieve crystallization. The transparent conductive film of the amorphous was formed even when the ITO target ((a) and (b) of FIG. 1) respectively containing samarium in an amount of about 3 wt. % and 5 wt. % was deposited at a high temperature of about 170° C. Also, the transparent conductive film of the amorphous was formed even when the ITO target ((c) of FIG. 1) containing samarium in an amount of about 7 wt. % was deposited at a high temperature of about 200° C.

Figure 2:
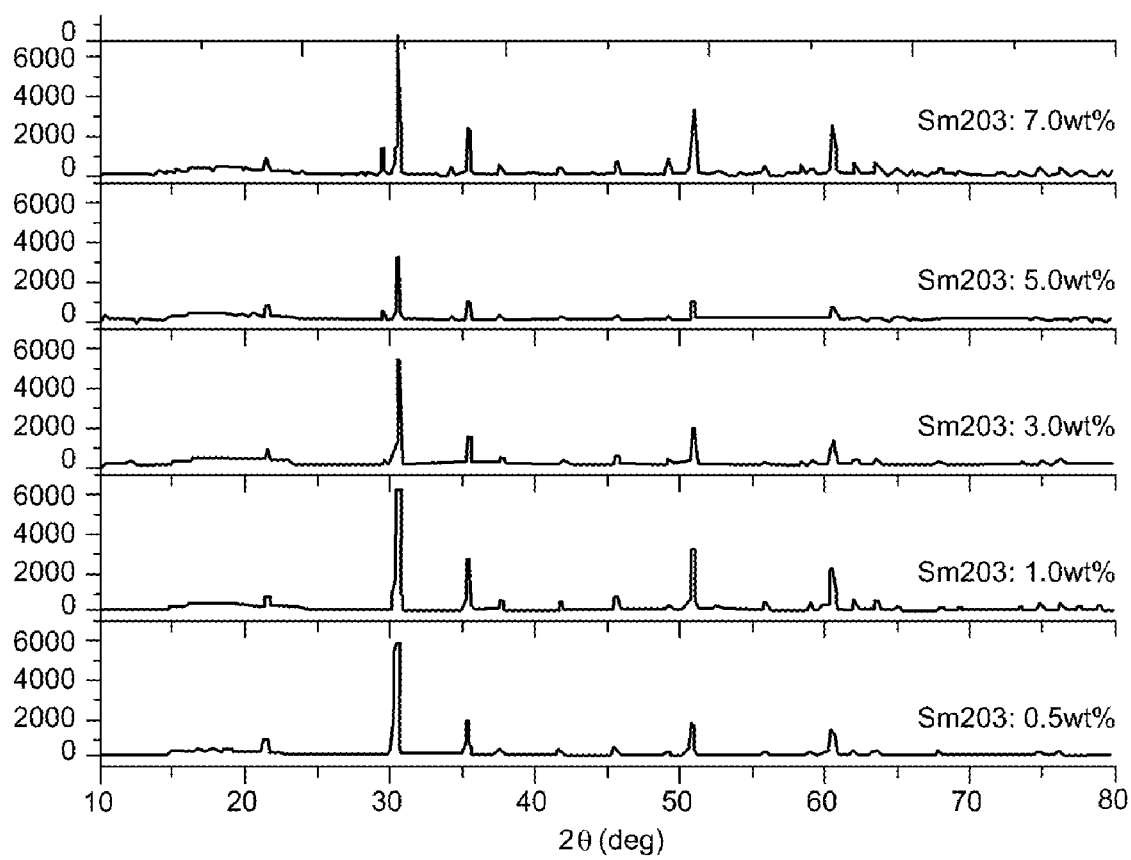
FIG. 2 is a graph illustrating x-ray diffraction results with respect to a transparent film formed by depositing an ITO target according to exemplary embodiments of the present invention at RT, and performing a heat treatment on the deposited ITO target at about 250° C. for about 60 minutes.

FIG. 2 is a graph illustrating x-ray diffraction results with respect to a transparent film formed by depositing the ITO target in Examples 1 to 5 at RT, and performing a heat-treatment on the deposited ITO target at about 250° C. for about 60 minutes. Only a peak originated from indium was observed in all thin films of Examples 1 to 5, and crystallization of each of the thin films was achieved. Specifically, the transparent conductive film deposited at room temperature to about 170° C. was in an amorphous state, however the crystallization of the transparent conductive film was achieved after performing the heat-treatment at a high temperature of about 250° C. as shown in FIGS. 1 and 2.

Also, as shown in Table 1 below, a temperature required for crystallizing the film increased along with an increase in the amount of the samarium, and the transparent conductive film of the amorphous was formed even when the ITO target containing samarium in an amount of about 3 wt. % or more was deposited at a temperature less than about 200° C. Also, the transparent conductive film of the amorphous was formed when the ITO target each containing the samarium in an amount of about 0.5 wt. % and 1 wt. % was deposited at a temperature less than about 170° C.

EXAMPLES 6 TO 10

An $In_2O_3$ powder having a mean particle diameter of 1 μm or less and a $SnO_2$ powder having a mean particle diameter of 3 μm or less were compound in a weight ratio of 9:1. Next, a $Yb_2O_3$ powder having a mean particle diameter of about 10 μm or less was mixed with a slurry tank to prepare a mixed powder in such a manner that an amount of the $Sm_2O_3$ powder was about 0.5 wt. % in Example 6, 1.0 wt. % in Example 7, 3.0 wt. % in Example 8, 5.0 wt. % in Example 9, 7.0 wt. % in Example 10 each based on a total weight of the entire powder, respectively.

A pure water, a dispersing agent, and a binder were added in the mixed powder, and a wet milling was performed on the resultant powder using a hard zirconia ball mill. The resultant powder was required to be pulverized for one hour for milling and mixing to prepare a slurry having a mean slurry particle size of 1 μm or less.

The slurry thus obtained was dried using a spray dryer to prepare a granular powder, and the granular powder was molded with a relatively high pressure of about 300 MPa using a Cold Isostatic Press (CIP) to prepare a molded body Next, the molded body was sintered at a high temperature of 1,600° C. for one hour under an air atmosphere to manufacture a sintered body of ITO containing ytterbium.

A sputtering surface of the sintered body of ITO thus obtained was grinded using a grinder to have a diameter of 3 inches and a thickness of 5 nm, and a backing plate was bonded to the sintered body of ITO using an indium-based alloy to thereby manufacture a target assembly of a sintered body. The presence of $Yb_2O_3$ within the target would be found by an Electron Probe Micro Analyzer (EPMA).

Results obtained by measuring a bulk resistance of the target according to each Example are shown in Table 1 below.

The target according to each Example was equipped in a magnetron sputtering apparatus, and an oxygen and an argon gas were injected at room temperature to form a transparent conductive film having a thickness of about 150 nm on a glass substrate.

Results obtained by measuring a light transmittance in a wavelength of about 550 nm with respect to the glass substrate with the transparent conductive film adhered thereon are shown in Table 1 below, in which a high transmittance of about 86% or more was shown. Also, a resistivity of the transparent conductive film deposited at room temperature is shown in Table 1 below. As shown in Table 1, it was found that the resistivity of the transparent conductive film of an amorphous formed in Examples 6 to 10 was within a range of about 579 to about 831 μΩ·cm.

Next, the transparent conductive films in Examples 6 to 10 were subjected to a heat-treatment at about 250° C. for 60 minutes to crystallize, and then results obtained by measuring the resistivity thereof are shown in Table 1 below. As shown in Table 1 below, it was found that the resistivity of each of the transparent conductive films in which crystallization was achieved through a heat-treatment of high temperature was within a range of about 188 to about 474 μΩ·cm.

Figure 3:
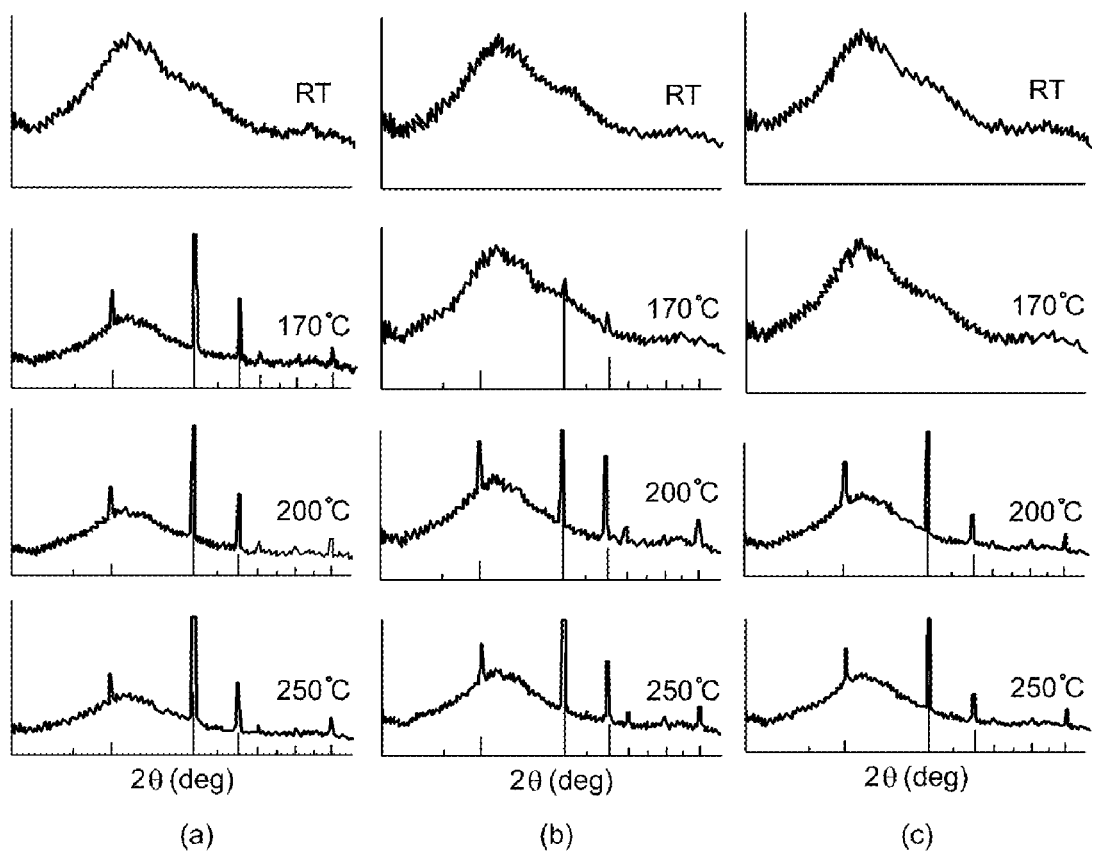
FIG. 3 is a graph illustrating x-ray diffraction results with respect to a transparent film formed by depositing an ITO target according to exemplary embodiments of the present invention at RT, about 170° C., about 200° C., and about 250° C., respectively.

FIG. 3 is a graph illustrating x-ray diffraction results with respect to a transparent film formed by depositing the ITO target according to Examples 6, 8, and 10 at RT, about 170° C., about 200° C., and about 250° C., respectively. (a), (b), and (c) of FIG. 3 may correspond to Examples 6, 8, and 10, respectively.

As shown in FIG. 3, it was found that a peak was observed at about 170° C. in Example 6, a peak was observed at about 200° C. in Example 8, and a peak was observed at about 200° C. to achieve crystallization. The transparent conductive film of the amorphous was formed even when the ITO target ((a) and (b) of FIG. 3) respective containing ytterbium in an amount of about 0.5 wt. % and 3.0 wt. % was deposited at a temperature less than about 170° C. Also, the transparent conductive film of the amorphous was formed even when the ITO target ((c) of FIG. 3) containing ytterbium in an amount of about 7.0 wt. % was deposited at a high temperature of about 170° C.

Figure 4:
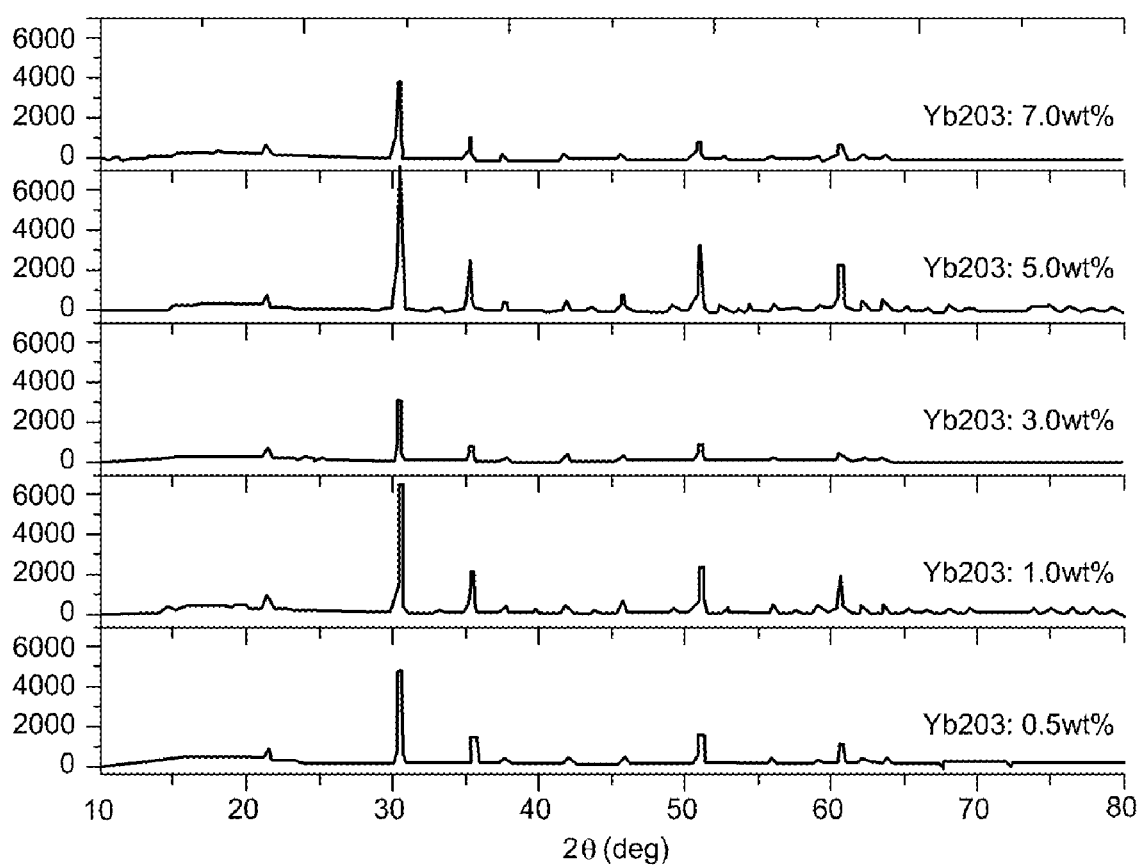
FIG. 4 is a graph illustrating x-ray diffraction results with respect to a transparent film formed by depositing an ITO target according to exemplary embodiments of the present invention at RT, and performing a heat treatment on the deposited ITO target at about 250° C. for about 60 minutes.

FIG. 4 is a graph illustrating x-ray diffraction results with respect to a transparent film formed by depositing the ITO target in Examples 6 to 10 at RT, and performing a heat treatment on the deposited ITO target at about 250° C. for about 60 minutes.

Only a peak originated from indium was observed in all thin films of Examples 6 to 10, and crystallization of each of the thin films was achieved. Specifically, the transparent conductive film deposited at room temperature to about 170° C. was in an amorphous state, however the crystallization of the transparent conductive film was achieved after performing the heat-treatment at a high temperature of about 250° C. as shown in FIGS. 3 and 4.

COMPARATIVE EXAMPLE 1

An $In_2O_3$ powder having a mean particle diameter of 1 μm or less and a $SnO_2$ powder having a mean particle diameter of 3 μm or less were compound in a weight ratio of 9:1 to thereby prepare a mixed powder. Pure water, a dispersing agent, and a binder were added in the mixed powder, and a wet milling, drying, molding, and sintering processes were performed in the same manner as that in Examples 1 to 10 to thereby prepare a pure sintered body of ITO without samarium or ytterbium added therein. The sintered body of ITO was processed in the same manner as that in Examples 1 to 10 to manufacture a target, and results obtained by measuring a bulk resistance and density of the target are shown in Table 1 below.

The target according to Comparative Example 1 was equipped in a magnetron sputtering apparatus, and oxygen and an argon gas were injected at room temperature to form a transparent conductive film having a thickness of about 150 nm on a glass substrate.

Results obtained by measuring a light transmittance in a wavelength of about 550 nm with respect to the glass substrate with the transparent conductive film adhered thereon are shown in Table 1 below.

Next, the transparent conductive film according to Comparative Example 1 was subjected to a heat-treatment at about 250° C. for 60 minutes, and results obtained by measuring a resistivity of the transparent conductive film are shown in Table 1 below.

TABLE 1

| Kind and content of dopant (wt. %) | Bulk resistance of target ($\mu\Omega \cdot$cm) | Density of target (g/cc) | Light transmittance of film deposited at high temperature (%) | Resistivity of film deposited at high temperature ($\mu\Omega \cdot$cm) | Resistivity of film subjected to heat-treatment at 250° C. | Temperature for crystallizing film (° C.) |
|---|---|---|---|---|---|---|
| Example 1 | Sm, 0.5 | 160 | 7.10 | 86 | 529 | 176 | 170 |
| Example 2 | Sm, 1.0 | 170 | 1.11 | 86 | 626 | 201 | 170 |
| Example 3 | Sm, 3.0 | 190 | 7.136 | 87 | 801 | 225 | 200 |
| Example 4 | Sm, 5.0 | 220 | 7.153 | 88 | 1107 | 263 | 200 |
| Example 5 | Sm, 7.0 | 250 | 7.182 | 89 | 1321 | 333 | 250 |
| Example 6 | Yb, 0.5 | 160 | 7.10 | 86 | 579 | 188 | 170 |
| Example 7 | Yb, 1.0 | 170 | 7.11 | 86 | 586 | 211 | 170 |
| Example 8 | Yb, 3.0 | 190 | 7.136 | 88 | 606 | 278 | 170 |
| Example 9 | Yb, 5.0 | 220 | 7.153 | 90 | 712 | 395 | 200 |
| Example 10 | Yb, 7.0 | 250 | 7.182 | 91 | 831 | 474 | 200 |
| Comparative Example 1 | Nothing | 350 | 7.14 | 86 | 430 | 182 | 140 |

As described above, it was found that crystallization of the thin film was achieved even when the deposition temperature of the ITO target is relatively low in a case of the ITO target without samarium or ytterbium added therein, whereas the transparent conductive film of the amorphous was deposited and formed at a temperature less than about 170° C. or even at about 200° C. according to the contents of the components in a case of the ITO target with samarium and ytterbium added therein. The transparent conductive film of the amorphous may be etched with a weak acid, thereby exhibiting superior etching workability compared to the existing target, and preventing creation of debris due to the etching process. Also, the transparent conductive film of crystalline having superior electric characteristics may be manufactured when being subjected to a heat-treatment at about 170 to about 250° C.

As described above according to the present invention, the ITO target has a relatively low bulk resistance, thereby performing a stable DC sputtering. Also, a density of the target is relatively high, thereby preventing occurrence of anomalous discharge and nodule at the time of sputtering.

The transparent conductive film of the amorphous formed on the substrate using the ITO target according to the present invention is etched with a weak acid, thereby preventing occurrence of corrosion of gate or data lines and creation of debris, which may be inevitably incurred by a strong acid in the existing target. Also, the transparent conductive film of the amorphous has a low resistivity and superior light transmittance.

The transparent conductive film of ITO according to the present invention crystallizes the thin film of the amorphous by means of a heat-treatment, thereby exhibiting superior etching workability and optical characteristics.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An indium tin oxide target including $Sm_2O_3$ and $Yb_2O_3$, wherein an amount of the $Sm_2O_3$ and $Yb_2O_3$ is about 0.5 wt. % to about 10 wt. % based on the weight of the target, wherein [Sm]/([In]+[Sm]) is about 0.005 to about 0.18, and [Yb]/([In]+[Yb]) is about 0.005 to about 0.18, and wherein [Sm] is a number of samarium atoms per unit mass of the target, [Yb] is a number of ytterbium atoms per unit mass of the target, and [In] is a number of indium atoms per unit mass of the target.

2. The indium tin oxide target of claim 1, wherein a Direct Current (DC) sputtering is applied to the indium tin oxide target.

3. The indium tin oxide target of claim 1, wherein a density of the indium tin oxide target is about 7.10 g/cc to about 7.18 g/cc.

4. The indium tin oxide target of claim 1, wherein a relative density of the indium tin oxide target is about 95% or more.

5. The indium tin oxide target of claim 1, wherein a bulk resistance of the indium tin oxide target is about 250 $\mu\Omega \cdot$cm or less.

* * * * *